US010083958B2

(12) United States Patent
Kannan et al.

(10) Patent No.: US 10,083,958 B2
(45) Date of Patent: Sep. 25, 2018

(54) DEEP TRENCH METAL-INSULATOR-METAL CAPACITORS

(71) Applicant: GLOBALFOUNDRIES Inc., Grand Cayman (KY)

(72) Inventors: Sukeshwar Kannan, Malta, NY (US); Somnath Ghosh, Ballston Spa, NY (US); Daniel Smith, Ballston Spa, NY (US); Luke England, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 61 days.

(21) Appl. No.: 15/292,488

(22) Filed: Oct. 13, 2016

(65) Prior Publication Data

US 2018/0108651 A1    Apr. 19, 2018

(51) Int. Cl.
| H01L 27/06 | (2006.01) |
| H01L 23/66 | (2006.01) |
| H01L 49/02 | (2006.01) |
| H01L 23/522 | (2006.01) |

(52) U.S. Cl.
CPC ...... *H01L 27/0682* (2013.01); *H01L 23/5226* (2013.01); *H01L 23/66* (2013.01); *H01L 28/20* (2013.01); *H01L 28/55* (2013.01); *H01L 28/60* (2013.01); *H01L 2223/6672* (2013.01)

(58) Field of Classification Search
None
See application file for complete search history.

(56) References Cited

U.S. PATENT DOCUMENTS

| 6,767,788 | B2 * | 7/2004 | Kim ................. H01L 21/76807 257/303 |
| 7,176,546 | B2 * | 2/2007 | Ahrens .............. H01L 27/0676 257/458 |
| 8,962,423 | B2 | 2/2015 | Cheng et al. |
| 9,224,801 | B2 | 12/2015 | Cheng et al. |
| 2002/0185671 | A1 * | 12/2002 | Kim ................. H01L 21/76807 257/301 |
| 2006/0073669 | A1 * | 4/2006 | Kim ................. H01L 27/10817 438/387 |
| 2010/0041203 | A1 * | 2/2010 | Collins ................ H01L 23/481 438/386 |
| 2015/0294970 | A1 * | 10/2015 | Jakushokas ............ H01L 28/20 257/503 |

FOREIGN PATENT DOCUMENTS

EP    3174094 A1    5/2017

* cited by examiner

*Primary Examiner* — Nishath Yasmeen
(74) *Attorney, Agent, or Firm* — Thompson Hine LLP; Yuanmin Cai

(57) ABSTRACT

Device structures for a metal-insulator-metal (MIM) capacitor, as well as methods of fabricating a device structure for a MIM capacitor. An active device level is formed on a substrate, a local interconnect level is formed on the active device level, and a metal-insulator-metal capacitor is formed in a via opening with a sidewall extending through the local interconnect level and the active device level to a given depth in the substrate. The metal-insulator-metal capacitor includes a first plate on the sidewall, a second plate, and an interplate dielectric between the first plate and the second plate.

19 Claims, 3 Drawing Sheets

DEEP TRENCH METAL-INSULATOR-METAL CAPACITORS

BACKGROUND

The present invention relates to semiconductor device fabrication and integrated circuits and, more specifically, to device structures for a metal-insulator-metal capacitor, as well as methods of fabricating a device structure for a metal-insulator-metal capacitor.

On-chip passive elements are commonly used in many types of integrated circuits, such as radiofrequency integrated circuits (RFICs). Metal-insulator-metal (MIM) capacitors and thin film resistors represent two types of on-chip passive elements commonly found in many types of integrated circuits, including RFICs. A two-electrode metal-insulator-metal capacitor may be formed as a stacked structure that includes upper and lower conductive plates, which operate as electrodes, and an interplate dielectric layer disposed between the upper and lower conductive plates. A thin film resistor is formed depositing and patterning a resistive material to a desired size and geometrical shape.

Improved device structures and fabrication methods are needed for a metal-insulator-metal capacitor.

SUMMARY

According to an embodiment, a structure includes an active device level on a substrate, a local interconnect level on the active device level, and a metal-insulator-metal capacitor in a via opening with a sidewall extending through the local interconnect level and the active device level to a given depth in the substrate. The metal-insulator-metal capacitor includes a first plate on the sidewall, a second plate, and an interplate dielectric between the first plate and the second plate.

According to another embodiment, a method includes forming an active device level on a substrate, forming a local interconnect level on the active device level, and forming a via opening with a sidewall extending through the local interconnect level and the active device level to a given depth in the substrate. The method further includes forming a metal-insulator-metal capacitor that includes a first plate on the sidewall of the via opening, a second plate, and an interplate dielectric between the first plate and the second plate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
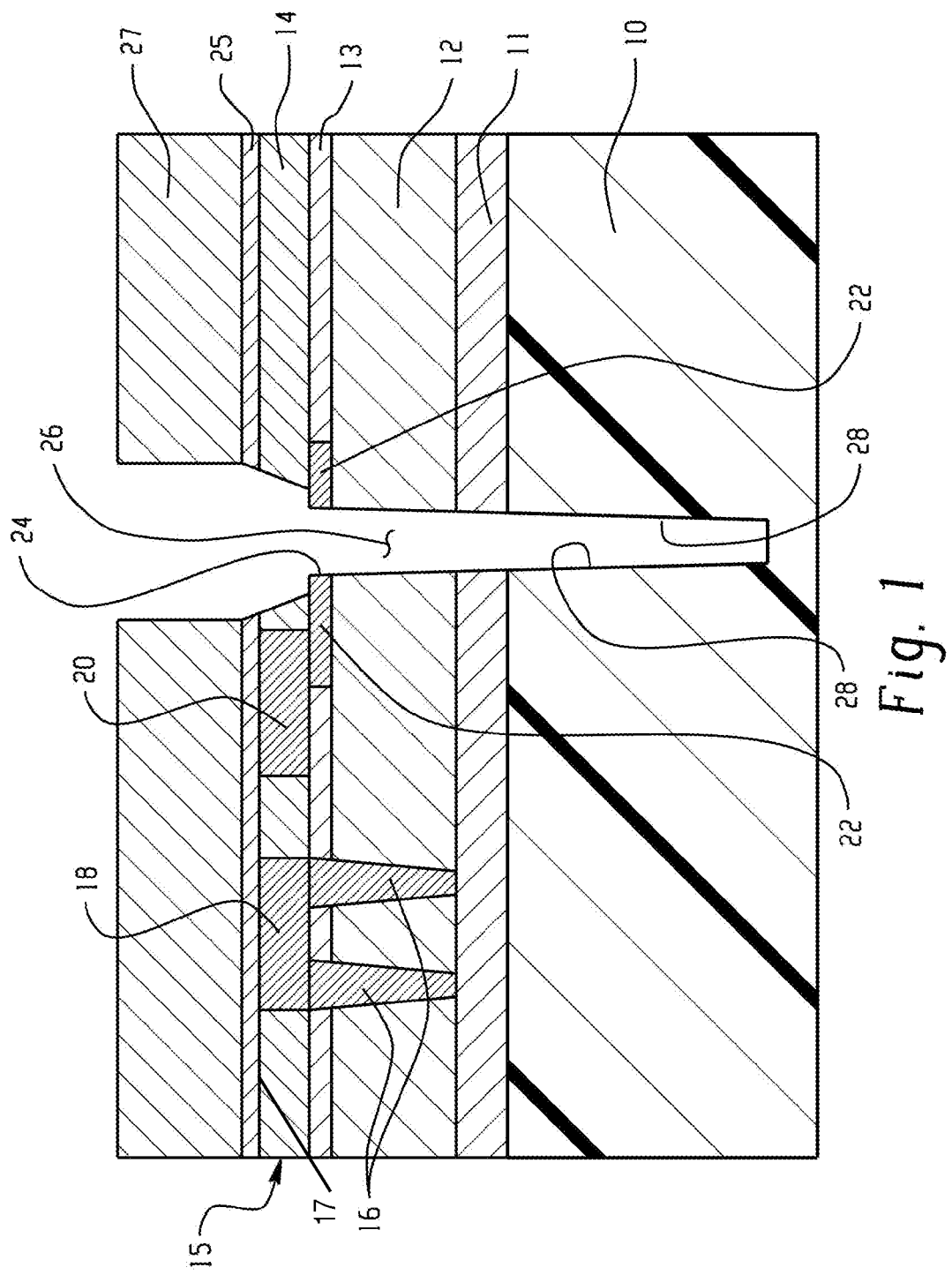
FIGS. 1-3 are cross-sectional views of a substrate at successive fabrication stages of a processing method to form a metal-insulator-metal capacitor in accordance with embodiments of the invention.

With reference to FIG. 1 and in accordance with an embodiment of the invention, a substrate 10 may be, for example, a bulk semiconductor wafer suitable for forming an integrated circuit, and may include device structures fabricated by front-end-of-line (FEOL) processing in an active device level 11. The FEOL processing may comprise, for example, complementary-metal-oxide-semiconductor (CMOS) processes used to build a combination of p-type and n-type field-effect transistors that are coupled to implement logic gates and other types of digital circuits.

Dielectric layers 12, 13, 14 are located on the active device level 11 vertically above the active device level 11. The dielectric layers 12, 13, 14 may be formed during middle-of-the-line (MOL) processing and used to form a local interconnect level 15 that includes contacts 16, 18, 20 and a resistor 22 embedded in one or more of the dielectric layers 12, 13, 14. The dielectric layers 12, 13, 14 may be composed of an electrically-insulating dielectric material, such as a silicon dioxide ($SiO_2$) deposited by chemical vapor deposition (CVD). The contacts 16, 18, 20 and the resistor 22 may be comprised of an electrically-conductive material, such as tungsten (W) or tungsten silicide ($WSi_2$), deposited by CVD in openings formed in the dielectric layers 12, 13, 14. The resistor 22 may have a rectangular shape and may include a perforation 24 that extends as an opening or hole in a direction through its thickness. The contact 20 is connected with a portion of the resistor 22, and does not extend to the active device level 11. In contrast to contact 20, the contacts 16, 18 may be connected with device structures in the active device level 11.

After the local interconnect level 15 is formed, a dielectric layer 25 composed of, for example, silicon carbon nitride (SiCN) is formed on a top surface 17 of the local interconnect level 15 and functions to cap the dielectric layer 12, the contacts 16, 18, 20, and the resistor 22. A via opening 26 is formed as a deep trench with sidewalls 28 that penetrate vertically from the top surface 17 of the local interconnect level 15 through the dielectric layer 25, the dielectric layers 12, 13, 14 of the local interconnect level 15, and the active device level 11 to a given depth of penetration into the substrate 10. The via opening 26 may be located partially in the local interconnect level 15, partially in the active device level 11, and partially in the substrate 10. The dielectric layer 25 is formed as part of the process forming the via opening 26 and is not part of wire or via levels located above the local interconnect level. The dielectric layer 25 protects the dielectric layer 12, the contacts 16, 18, 20, and the resistor 22 during the process forming the via opening 26.

The via opening 26 may be fabricated by deep reactive ion etching (e.g., a Bosch process) in the presence of an etch mask 27 that is applied on the dielectric layer 25. The etch mask 27 may be composed of, for example, a photoresist material that is applied by a spin coating process, pre-baked, exposed to a radiation projected through a photomask, baked after exposure, and developed with a chemical developer to define an opening that coincides with the intended location for the via opening 26. The location of the via opening 26 may be chosen, through the formation of the etch mask 27, such that the sidewalls 28 coincide with the location of the perforation 24 in the resistor 22 and are spaced horizontally from the location at which the contact 20 is connected with the resistor 22. For example, the via opening 26 may have a diameter of greater than or equal to 2 micrometers in the substrate 10 and the via opening 26 may have a depth of 20 micrometers partially in the local interconnect level 15, partially in the active device level 11, and partially in the substrate 10. The width of the via opening 26 may vary with depth over the extent of the sidewalls 28. Within the dielectric layer 14, the width of the via opening 26 is chosen to partially expose a top surface of the resistor 22.

Figure 2:
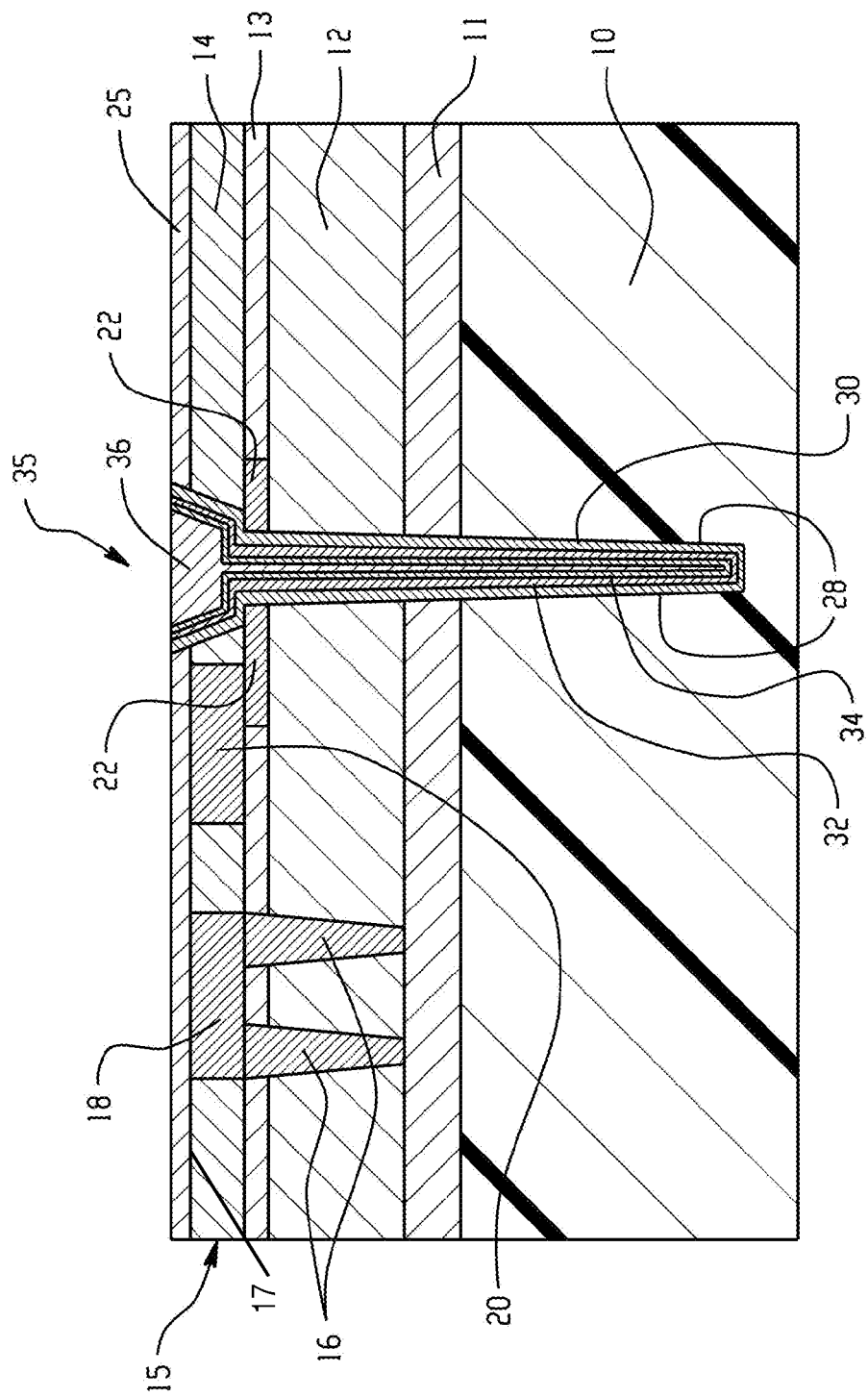

With reference to FIG. 2 in which like reference numerals refer to like features in FIG. 1 and in a subsequent fabrication stage of the processing method, the etch mask 27 is stripped, and a conductor layer 30 of a given thickness is formed on the sidewalls 28 of the via opening 26 and also in the field area on the dielectric layer 14. The conductor layer 30, which conforms to the three-dimensional geometrical shape of the via opening 26, may be comprised of a conductor such as titanium nitride (TiN), titanium (Ti), ruthenium (Ru), tantalum (Ta), tantalum nitride (TaN), or a multilayer combination of these materials (e.g., a TiN/Ta bilayer) deposited by physical vapor deposition (PVD) with, for example, a sputtering process. In an embodiment, the conductor layer 30 is free of copper (Cu) in its composition. The conductor layer 30 overlaps with the resistor 22 at and near the location at which the via opening 26 penetrates through the resistor 22.

A dielectric layer 32 of a given thickness is formed on the sidewalls 28 of the via opening 26 and also in the field area on the top surface of the dielectric layer 14. The dielectric layer 32, which covers the conductor layer 30 inside the via opening 26 and conforms to the three-dimensional geometrical shape of the via opening 26, may be comprised of a dielectric or insulating material, such as a high-k dielectric material like hafnium aluminum oxide (HfAlO$_x$) or hafnium oxide (HfO$_x$), deposited by, for example, atomic layer deposition (ALD). Such high-k dielectric materials have a dielectric constant (e.g., permittivity or k) that is significantly larger than the dielectric constant of silicon dioxide (e.g., greater than about 3.9). In an embodiment, the dielectric constant of the dielectric layer 32 may be greater than or equal to 20. In an embodiment, the dielectric constant of the dielectric layer 32 may be greater than or equal to 18. For example, the dielectric constant of hafnium aluminum oxide is nominally equal to 20 and the dielectric constant of hafnium oxide is nominally equal to 18.

A conductor layer 34 of a given thickness is formed on the sidewalls 28 of the via opening 26 and also in the field area on the dielectric layer 14. The conductor layer 34, which covers the layers 30, 32 inside the via opening 26 and conforms to the three-dimensional geometrical shape of the via opening 26, may be comprised of a conductor such as titanium nitride (TiN), titanium (Ti), ruthenium (Ru), tantalum (Ta), tantalum nitride (TaN), or a multilayer combination of these materials (e.g., a TiN/Ta bilayer) deposited by PVD with, for example, a sputtering process. In an embodiment, the conductor layer 34 is free of copper (Cu) in its composition. The dielectric layer 32 electrically isolates the conductor layer 34 from the conductor layer 30 and, therefore, electrically isolates the conductor layer 34 from the resistor 22.

The conductor layer 30, the dielectric layer 32, and the conductor layer 34 constitute a metal-insulator-metal (MIM) capacitor, generally indicated by reference numeral 35. The conductor layers 30, 34 constitute the electrodes of the MIM capacitor 35. Specifically, the conductor layer 30 constitutes a lower plate of the MIM capacitor 35, and the conductor layer 34 constitutes an upper plate of the MIM capacitor 35. The dielectric layer 32 constitutes an interplate dielectric that is disposed as a separating layer between the upper and lower electrodes or plates. The conformal arrangement of the layers 30, 32, 36 inside the via opening 26 results in a three-dimensional and non-planar construction for the MIM capacitor 35. The layers 30, 32, 34 of the MIM capacitor 35 are located at or below beneath the top surface 17 of the local interconnect level 15, which may be considered to include the dielectric layer 25 that is formed after the local interconnect level 15 is formed and before the via opening 26 is formed.

A conformal seed layer (not shown) may be formed on the sidewalls 28 of the via opening 26 and covers the conductor layer 34. The seed layer may be comprised of copper (Cu), such as elemental Cu or co-deposited chromium-copper (Cr—Cu), applied using, for example, PVD. After the deposition of the seed layer, a thicker metal layer 36 comprised of a low-resistivity conductor, such as copper (Cu), may be deposited using a deposition process, such as electroplating or another electrochemical plating process, different than the deposition process used to deposit the seed layer. The seed layer may be required to carry the electrical current needed to initiate an electroplating process forming the metal layer 36 and may be subsumed into the metal layer 36. Alternatively, the metal layer 36 may be deposited with an electroless deposition process, which would permit the seed layer to be omitted.

Figure 3:
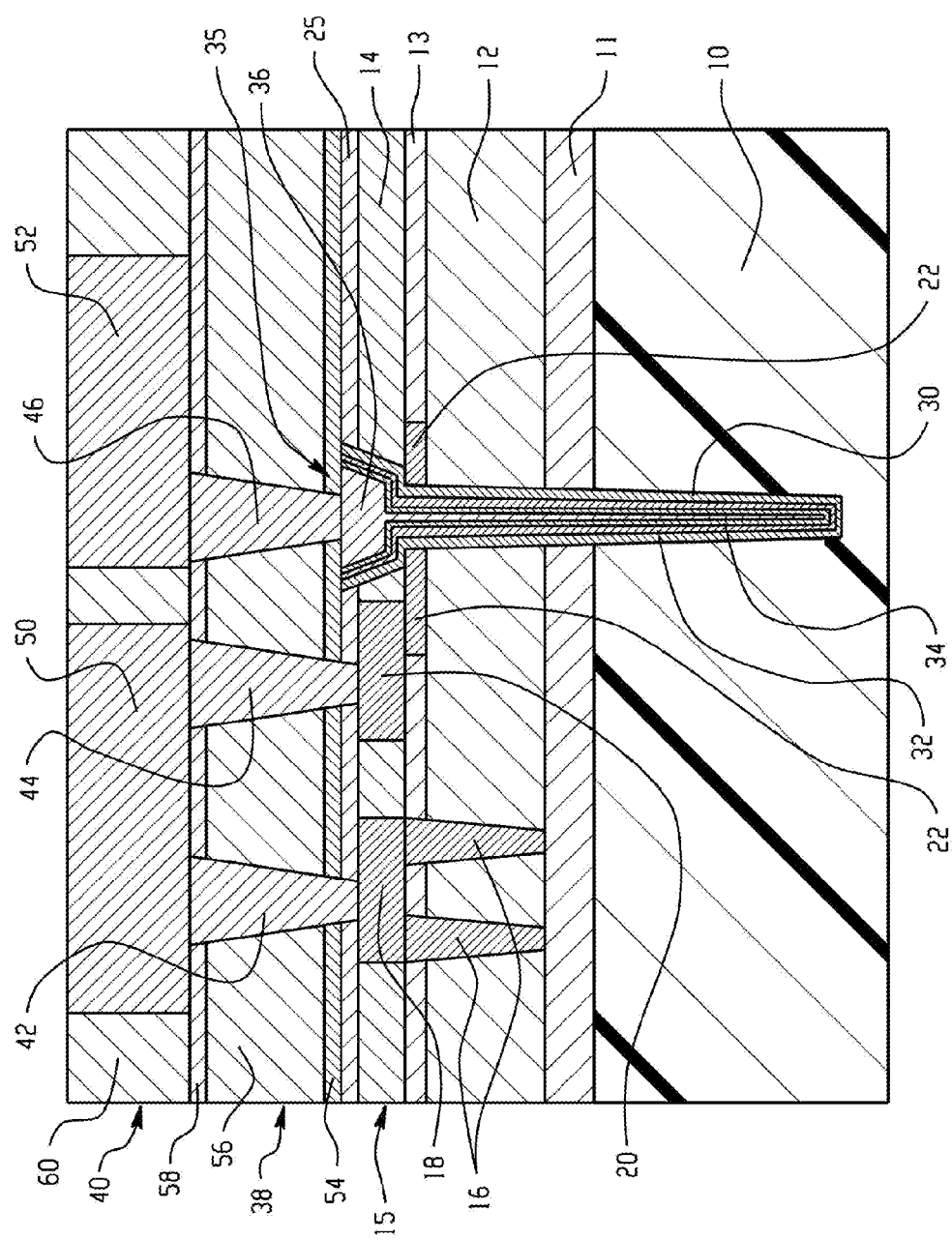

With reference to FIG. 3 in which like reference numerals refer to like features in FIG. 2 and in a subsequent fabrication stage of the processing method, the layers 30, 32, 34, 36 may be planarized, such as with a sequence of chemical mechanical polishing (CMP) processes, to remove the respective materials from the field area on top of the dielectric layer 14. Material removal during each CMP process combines abrasion and an etching effect that polishes and removes the targeted material. Each chemical mechanical polishing process may be conducted with a commercial tool using a polishing pad and a slurry selected to polish the targeted material.

Back-end-of-line (BEOL) processing follows to form a BEOL stack that includes a via level 38 and a wiring level 40 on the dielectric layer 25 and on top of the local interconnect level 15. The via level 38 includes vias 42, 44, 46, and the wiring level 40 includes a wire 50 that is connected by via 42 with the contact 18 and that is connected by via 44 and the contact 20 with the portion of the resistor 22, and a wire 52 that is connected by via 46 with the metal layer 36. The via level 38 includes dielectric layers 54, 56 in which the vias 42, 44, 46 are embedded, and the wiring level 40 includes dielectric layers 58, 60 in which the wires 50, 52 are embedded. The vias 42, 44 also extend through the capping dielectric layer 25. The wiring level 40 may represent a first metal level (M1) that is closest to the local interconnect level, and the via level 38 may represent a first via level (V0) that is closest to the local interconnect (CA) level.

The vias 42, 44, 46 and the wires 50, 52 in the first metal level may be formed by a single damascene process or by a dual damascene process. To that end, via openings and trenches are defined in the dielectric layers 54, 56, 58, 60 by photolithography and etching, and the via openings and trenches are filled by a conductor, such as copper (Cu), that is polished to form the vias 42, 44, 46 and the wires 50, 52.

The metal layer 36 inside the via opening 26 operates as an extension of the via 46 for purposes of contacting the conductor layer 34 functioning as the upper plate of the MIM capacitor 35. The metal layer 36 and the via 46 may both be constituted by copper (Cu), which is a different conductor than contained in conductor layers 30, 34. The via 44 is connected by the contact 20 with a portion of the resistor 22, which in turn is connected with the conductor layer 30 functioning as the lower plate of the MIM capacitor 35.

The MIM capacitor 35 is integrated into MOL processing during which the local interconnect structure is formed, and before BEOL processing is initiated. In particular, the plates and the interplate dielectric of the MIM capacitor 35 are formed before the first metal level (e.g., via 46 and wire 52)

of the BEOL stack is formed. No portion of the MIM capacitor 35 is formed in the BEOL stack above the local interconnect level including the wiring level 40. In other words, the metal-insulator-metal capacitor 35 in its entirety is located vertically between the substrate 10 and the first metal level. Neither of the plates of the MIM capacitor 35 includes copper from either the local interconnect level or the BEOL stack, and the formation of the plates and the interplate dielectric is completed before the metal layer 36, the via level 38, and the wiring level 40. The layers 30, 32, 34 representing the plates and interplate dielectric of the MIM capacitor 35 are formed as a conformal layer stack inside of the via opening 26 and without the need for layer patterning or a contribution from the metallization from the BEOL stack.

The MIM capacitor 35 may be used, among other applications, as a decoupling capacitor in a power delivery network or as a decoupling capacitor in a high performance DC-to-DC converter. The MIM capacitor 35 has a three-dimensional design that conserves space on a chip in comparison with two-dimensional (e.g., flat plate) designs. The MIM capacitor 35 may be replicated in an array that has a dense pattern (e.g., with a minimum pitch of 12 micrometers). The fabrication of the MIM capacitor 35 may leverage existing process modules, such as the process module for forming through-silicon-vias that may be used to form the via opening 26.

In an embodiment in which the interplate dielectric (i.e., dielectric layer 32) is hafnium aluminum oxide ($HfAlO_x$) within the context of the three-dimensional architecture of the via opening 26, the capacitance density may exceed 100 $nF/mm^2$ and the breakdown voltage may exceed 10 volts, which are limitations observed when using layers of the BEOL stack to construct a MIM capacitor. These performance metrics may exceed the performance metrics achievable with the use of a different high-k dielectric characterized by a lower dielectric contact or achievable using wire in the wiring layers of the BEOL stack to construct a MIM capacitor.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a substrate;
an active device level on the substrate;
a local interconnect level on the active device level;
a metal-insulator-metal capacitor in a via opening with a sidewall extending through the local interconnect level and the active device level to a given depth in the substrate, the metal-insulator-metal capacitor including a first plate on the sidewall, a second plate, and an interplate dielectric between the first plate and the second plate; and
a resistor in the local interconnect level,
wherein the first plate is coupled with a first portion of the resistor, and the via opening extends through a perforation in the resistor.

2. The structure of claim 1 further comprising:
a first via level on the local interconnect level, the first via level including a contact coupled with a second portion of the resistor.

3. The structure of claim 2 further comprising:
a first metal level on the first via level, the first metal level including a wire coupled by the contact with the second portion of the resistor.

4. The structure of claim 1 wherein the interplate dielectric is hafnium aluminum oxide ($HfAlO^x$).

5. The structure of claim 1 wherein the interplate dielectric has a dielectric constant that is greater than or equal to 20.

6. The structure of claim 1 wherein the first plate and the second plate are comprised of titanium nitride, and the interplate dielectric is comprised of hafnium aluminum oxide.

7. The structure of claim 1 further comprising:
a first via level on the local interconnect level, the first via level including a first contact coupled with the first plate; and
a first metal level on the first via level, the first metal level including a wire coupled by the first contact with the first plate,
wherein the local interconnect level is located vertically between the substrate and the first metal level.

8. The structure of claim 7 wherein the first via level includes a second contact coupled with the second plate.

9. The structure of claim 8 wherein the first plate and the second plate are comprised of a conductor that is free of copper, and further comprising:
a layer comprised of copper that is positioned in a space interior of the second plate inside the via opening,
wherein the second contact is coupled by the layer with the second plate.

10. The structure of claim 1 wherein the first plate and the second plate are comprised of a conductor that is free of copper.

11. A method comprising:
forming an active device level on a substrate;
forming a local interconnect level on the active device level;
forming a via opening with a sidewall extending through the local interconnect level and the active device level to a given depth in the substrate; and
forming a metal-insulator-metal capacitor that includes a first plate on the sidewall of the via opening, a second plate, and an interplate dielectric between the first plate and the second plate; and
forming a resistor in the local interconnect level, wherein the first plate is coupled with a first portion of the resistor, and the via opening extends through a perforation in the resistor.

12. The method of claim 11 further comprising:
forming a first via level on the local interconnect level, wherein the first via level includes a contact coupled with a second portion of the resistor.

13. The method of claim 12 further comprising:
forming a first metal level on the first via level,
wherein the first metal level includes a wire coupled by the contact with the second portion of the resistor.

14. The method of claim 11 wherein the interplate dielectric is hafnium aluminum oxide ($HfAlO_x$).

15. The method of claim 11 further comprising:
forming a first via level on the local interconnect level; and
forming a first metal level on the first via level,
wherein the first via level includes a first contact coupled with the first plate, the first metal level includes a wire coupled with the first contact, and the local interconnect level is located vertically between the substrate and the first metal level.

16. The method of claim 15 further comprising:
forming a second contact in the first via level that is coupled with the second plate.

17. The method of claim 16 wherein the first plate and the second plate are comprised of a conductor that is free of copper, and further comprising:
forming a layer comprised of copper that is positioned in a space interior of the second plate inside the via opening,
wherein the second contact is coupled by the layer with the second plate.

18. The structure of claim 1 wherein the metal-insulator-metal capacitor has a capacitance density greater than 100 $nF/mm^2$, and a breakdown voltage greater than 10 volts.

19. The method of claim 11 wherein the metal-insulator-metal capacitor has a capacitance density greater than 100 $nF/mm^2$, and a breakdown voltage greater than 10 volts.

* * * * *